United States Patent [19]

Blume, Jr. et al.

[11] 4,306,163
[45] Dec. 15, 1981

[54] PROGRAMMABLE SINGLE CHIP MOS COMPUTER

[75] Inventors: Henry M. Blume, Jr., Portola Valley; David A. Stamm, Santa Clara; David L. Budde, San Jose, all of Calif.

[73] Assignee: Intel Corporation, Santa Clara, Calif.

[21] Appl. No.: 9,116

[22] Filed: Feb. 5, 1979

Related U.S. Application Data

[60] Division of Ser. No. 877,108, Feb. 13, 1978, Pat. No. 4,153,933, which is a continuation of Ser. No. 636,535, Dec. 1, 1975, abandoned.

[51] Int. Cl.³ .................... H03K 17/26; H03K 19/00
[52] U.S. Cl. ................................. 307/475; 307/449; 307/584
[58] Field of Search ............... 307/205, 251, 264, 270, 307/DIG. 1, DIG. 5, 475, 449, 584; 365/189, 230; 364/900 MS File

[56] References Cited

U.S. PATENT DOCUMENTS

| | | | |
|---|---|---|---|
| 3,757,308 | 9/1973 | Fosdick | 364/200 |
| 3,778,784 | 12/1973 | Karp et al. | 307/DIG. 1 X |
| 3,824,564 | 7/1974 | Wegener | 307/DIG. 5 X |
| 3,892,957 | 7/1975 | Bryant | 364/200 |
| 3,940,747 | 2/1976 | Kuo et al. | 307/DIG. 1 X |
| 3,971,001 | 7/1976 | Lodi | 307/DIG. 5 X |
| 4,000,429 | 12/1976 | Yoshida et al. | 307/DIG. 5 X |

*Primary Examiner*—Larry N. Anagnos
*Attorney, Agent, or Firm*—Blakely, Sokoloff, Taylor & Zafman

[57] ABSTRACT

A buffer utilizing MOS devices for coupling a computer input data line and a computer output data line to a single input/output port is disclosed. The buffer receives a control signal generated by computer port control means at the beginning of any buffer cycle when data is to be accepted by the buffer.

9 Claims, 7 Drawing Figures

COLUMN DECODER

PROGRAMMING CIRCUIT

PROGRAMMABLE SINGLE CHIP MOS COMPUTER

This is a division of application Ser. No. 877,108, filed Feb. 13, 1978, now U.S. Pat. No. 4,153,933, which is a continuation application of Ser. No. 636,535 filed Dec. 1, 1975, now abandoned.

BACKGROUND OF THE INVENTION

1. Field of the Invention

The invention relates to the field of MOS computers.

SUMMARY OF THE INVENTION

In an MOS digital computer which is entirely included on a single substrate, a buffer for coupling the input and output of a computer to a single input/output port is disclosed. The computer includes a bidirectional data bus having a terminal for coupling two external circuit means and two additional "quasi" bidirectional data buses comprising the input and output data lines of the computer. The buffer couples the input and output lines to a single data port. MOS devices comprising the buffer serve to provide the characteristics of a bidirectional data port.

DETAILED DESCRIPTION OF THE INVENTION

Figure 1:
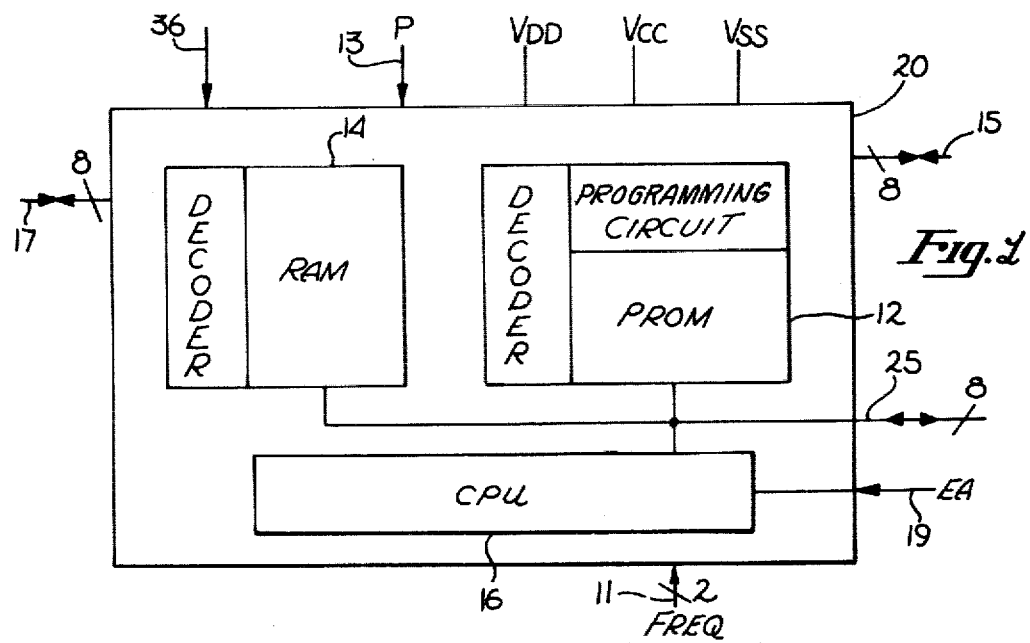
FIG. 1 is an overall block diagram of the computer illustrating its three primary sections, a CPU, RAM and PROM.
Figure 2:
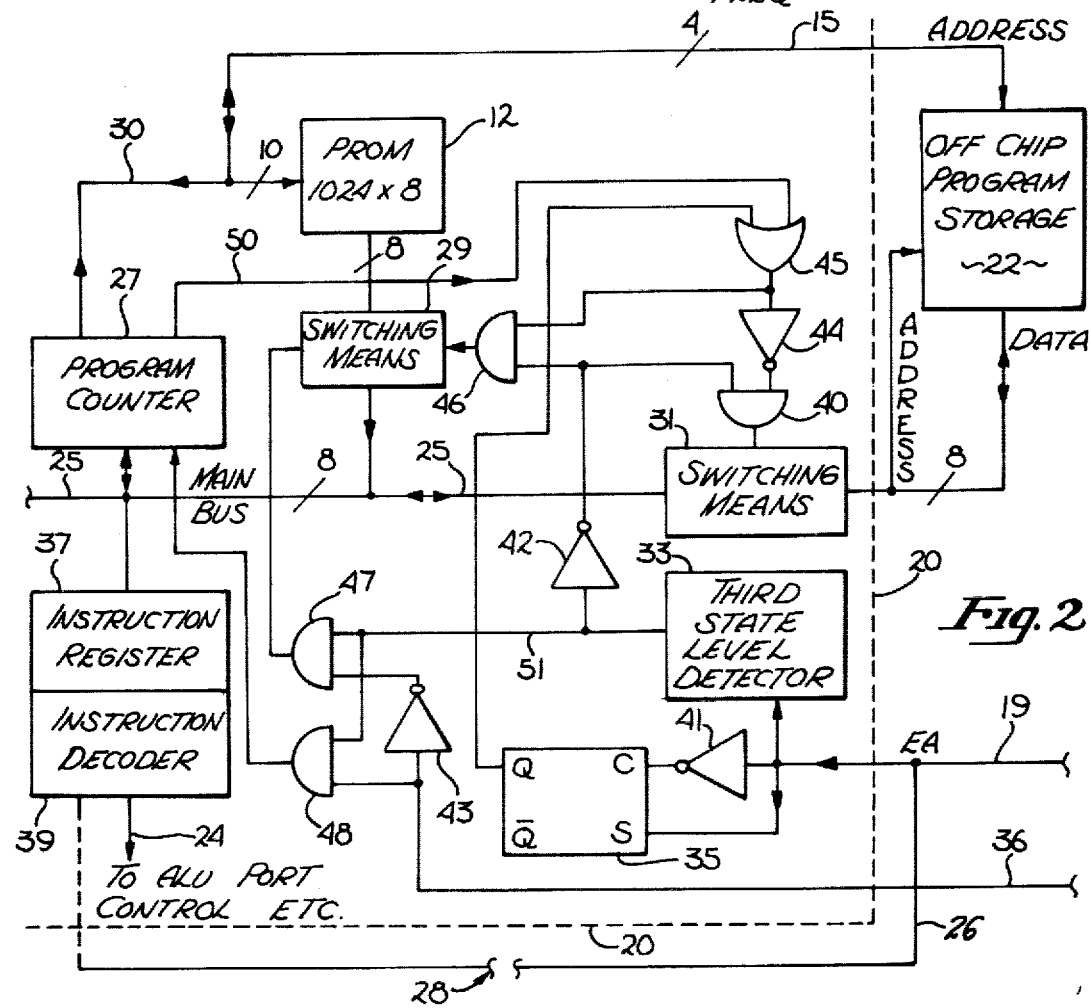
FIGS. 2 to 4 illustrate detailed circuits associated with the computer, shown in block diagram in FIG. 1, and which are explained fully in parent application Ser. No. 877,108, and now U.S. Pat. No. 4,153,933.
Figure 3:
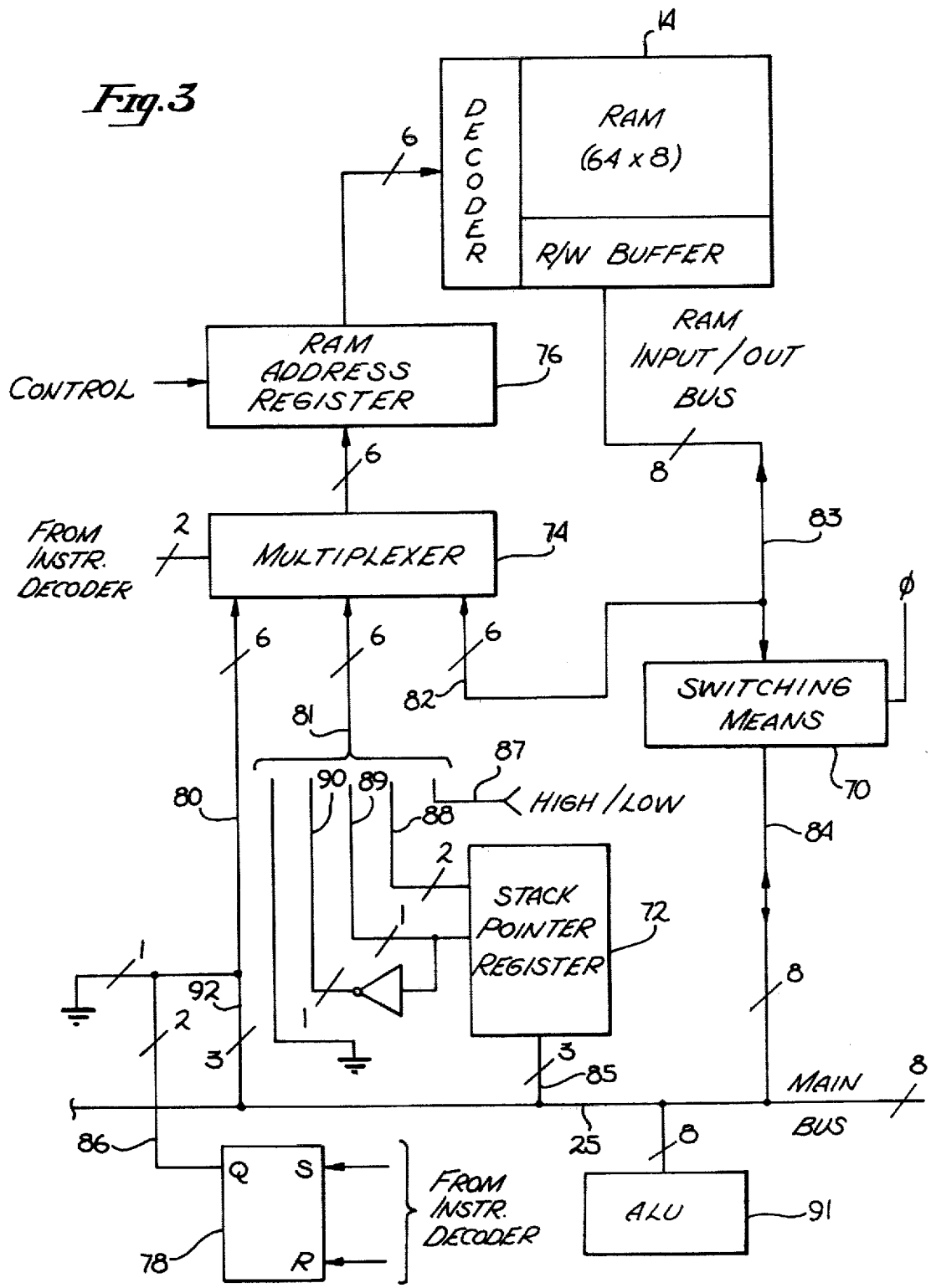
Figure 4:
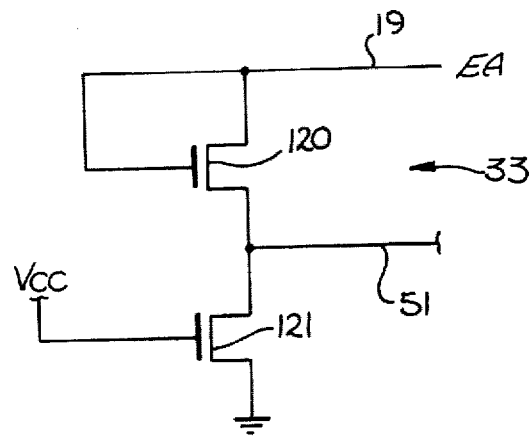

An integrated circuit, metal-oxide-semiconductor (MOS) digital computer entirely included on a single silicon substrate is disclosed. The computer includes a central processing unit (CPU), a random-access memory (RAM), and a programmable read-only memory (PROM) for storing computer instructions. Referring to FIG. 1, the computer is shown on substrate 20 as including PROM 12, RAM 14, and CPU 16, which are interconnected by a main, bidirectional data bus 25. This eight-line data bus, in addition to communicating with the eight-bit CPU 16, RAM 14 and PROM 12, communicates with external circuits through a plurality of input/output ports. In its presently preferred embodiment the computer is realized in n-channel MOS devices employing polycrystalline silicon gates. Only a single power supply (five volts) is required for computer operations, other than programming. The computer is adaptable for processing over seventy instructions, most of which are single cycle instructions with an instruction execution time of two to six microseconds.

In this disclosure many specific details concerning the computer and the buffer have not been included since they are known in the art, would complicate the disclosure, and would obscure the novel points of the computer and the buffer. It will also be appreciated however, that many of the specific details that are included, are included to explain the novel features of the computer and the buffer, and are not specifically necessary to practice the disclosed inventive concepts.

In FIG. 1 some of the input and output lines of the computer are illustrated such as the ground line $V_{SS}$. The computer utilizes during normal (non-programming) operation, a single (positive) five volt power source which is identified as $V_{CC}$. While the computer is operating this five volt potential is also applied to the line identified as $V_{DD}$; however, during the programming of the PROM 12, a potential of twenty-five volts is applied to the $V_{DD}$ line.

The computer as shown in FIG. 1 includes three, eight-bit data buses: the main bidirectional data bus 25, and two additional "quasi" bidirection data buses 15 and 17. The buffer amplifiers employed on each line of buses 15 and 17 shall be discussed in detail in conjunction with FIG. 5.

The CPU 16 of FIG. 1 performs standard arithmetic operations and control functions for the computer. Thus, known circuits may be employed in this unit. This unit includes an arithmetic logic unit (ALU) for adding, exclusive ORing, logic AND and OR operations and for shifting. The CPU also includes an twelve-bit program counter. Other known circuit means are included with the CPU such as an instruction decoder, port control means, stack pointer register, and a RAM address register and related logic means. Further details regarding the computer may be found in copending application Ser. No. 877,108 filed Feb. 13, 1978.

As previously mentioned the buses 15 and 17 of FIG. 1 are "quasi" bidirectional, these buses appear to be bidirectional from an external standpoint. However, each line of these buses includes a separate input line and output line between the buffer and the remainder of the computer. This buffer permits buffered outputs, and also allows external inputs to be applied to input/output ports.

Figure 5:
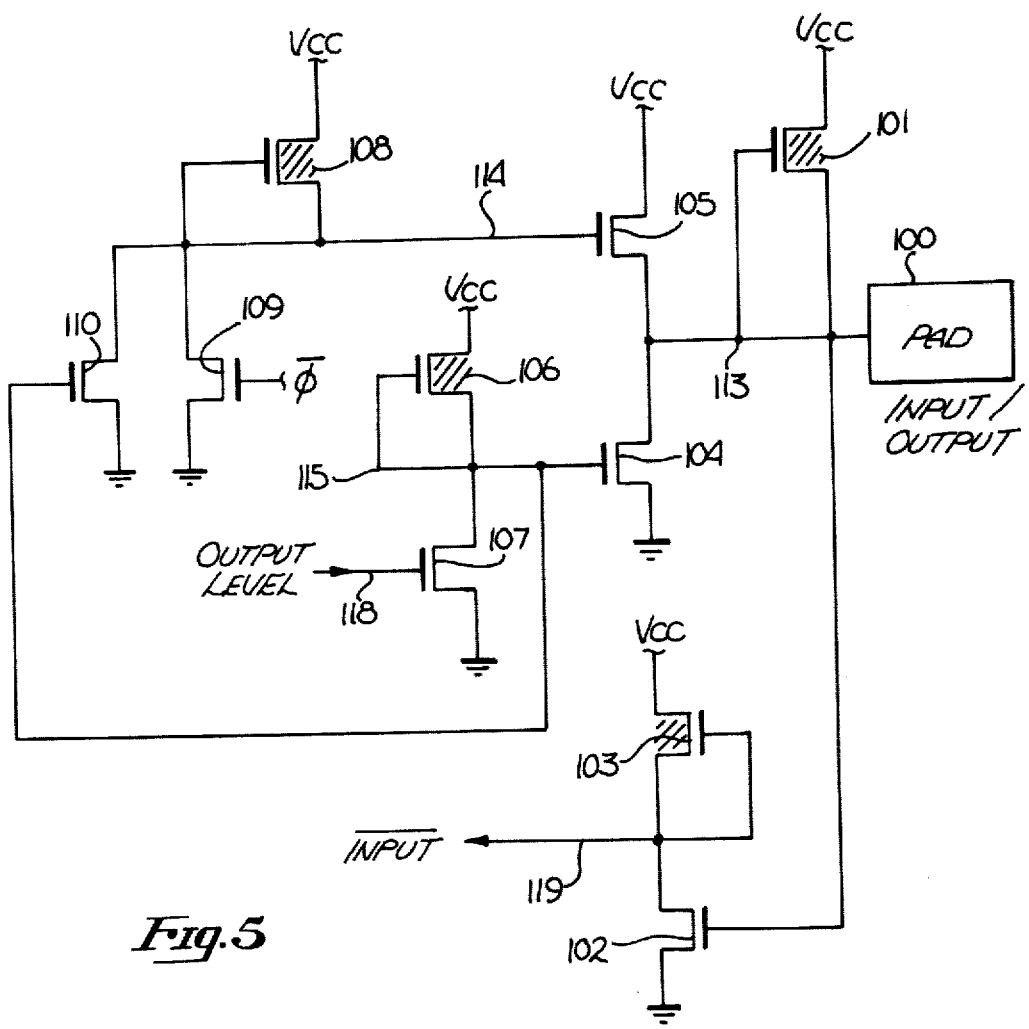
FIG. 5 is a circuit diagram of a buffer employed on the "quasi" bidirectional data lines of the computer.
Figure 6:
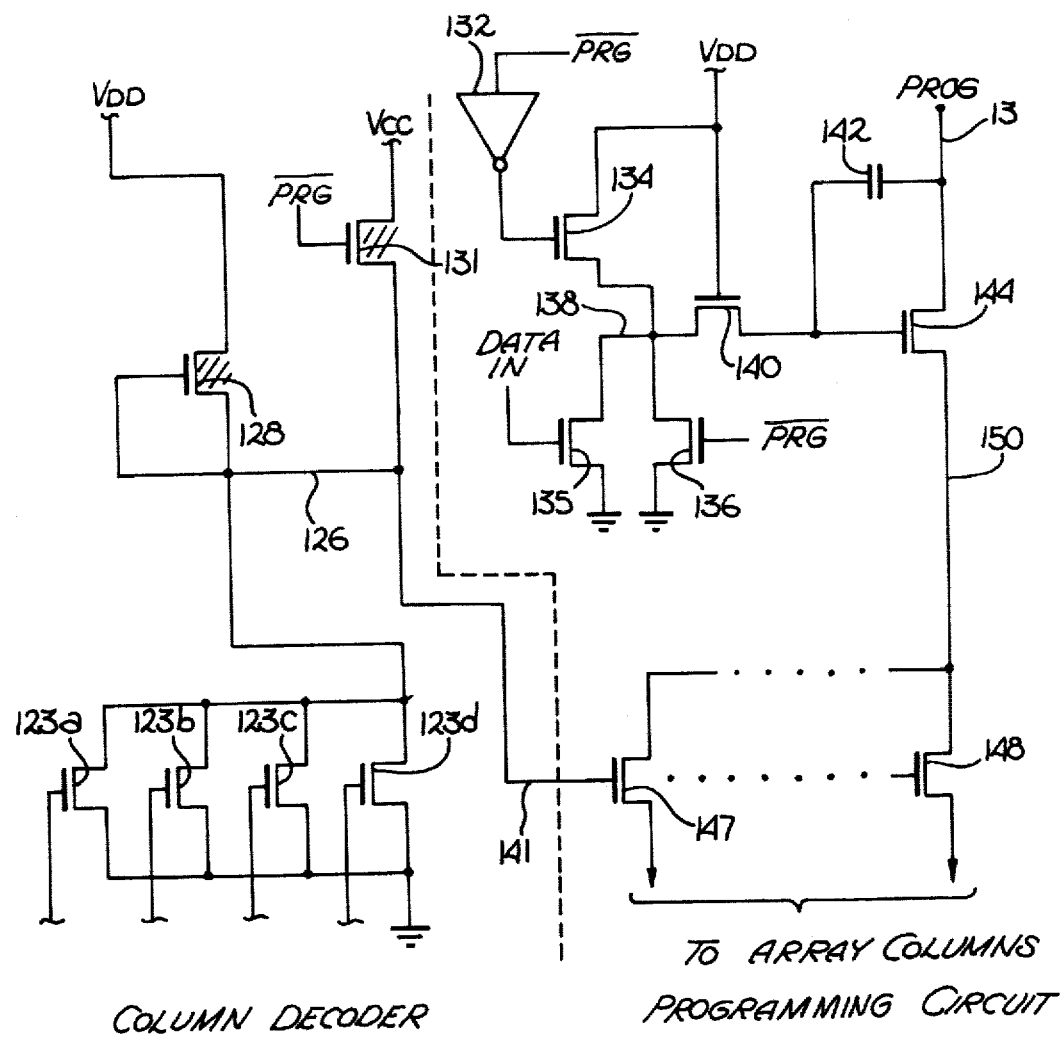
FIGS. 6 and 7 illustrate circuit diagrams of a column decoder and a row decoder and which are explained fully in parent application Ser. No. 877,108, and now U.S. Pat. No. 4,153,933.
Figure 7:
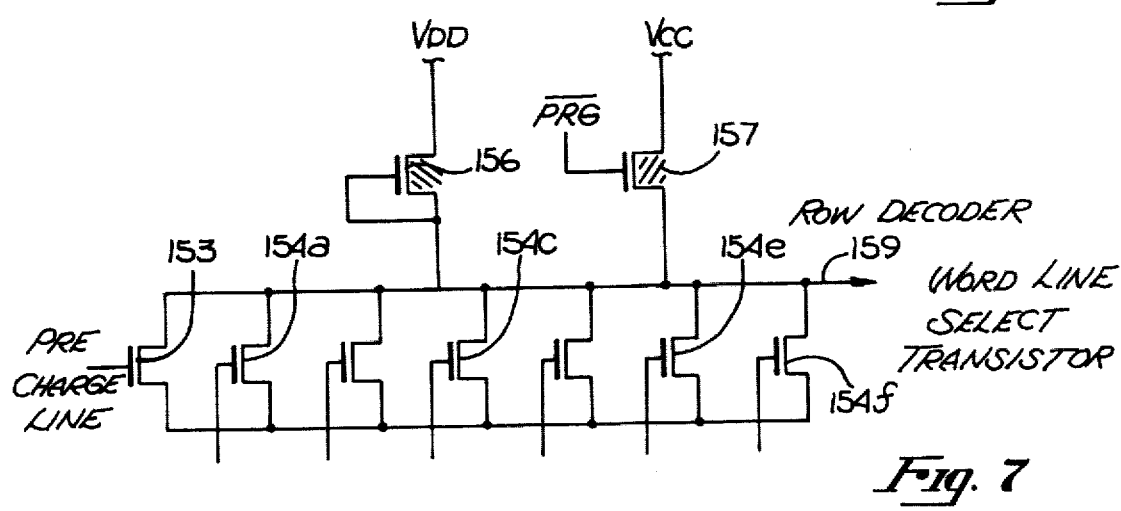

Referring now to FIG. 5, each port includes a pad 100, an input line to the buffer (output from the computer), such as line 118, and an output line from the buffer (input to the computer), such as line 119. The signal on line 119 is the complement of the input signal applied to the pad 100. The input pad 100 is coupled to a node 113, which node is coupled to $V_{CC}$ through a depletion mode transistor 101. The resistance of this transistor is relatively high, and this transistor is used to maintain node 113 at the $V_{CC}$ potential once the node is charged through pull-up transistor 105. The gate of transistor 105 is coupled to node 114; this node is coupled to $V_{CC}$ through a depletion mode transistor 108, and to ground through parallel transistors 109 and 110. Transistor 109 has its gate coupled to the source of the $\bar{\phi}$ signal, while transistor 110 has its gate coupled to node 115. Node 113 is pulled-down through transistor 104; the gate of transistor 104 is common with node 115. Node 115 is coupled to the $V_{CC}$ potential through a depletion mode transistor 106, and to ground through transistor 107. Transistors 104 and 105 are relatively large, hence have low resistance when compared to transistor 101.

Assume that a high level signal (i.e. five volts) is present on line 118, indicating that a binary one is to be written onto pad 100. During buffer operation once a high level signal is applied to line 118, the signal remains on this line until a binary zero is to be communicated to pad 100. This level signal causes the transistor 107 to conduct, bringing node 115 low, in turn, preventing device 110 from conducting. At the beginning of any buffer cycle the computer port control means brings the $\overline{\phi}$ signal low, hence transistor 109 does not conduct for these conditions. Since neither transistors 109 nor 110 are conducting, node 114 is pulled to the $V_{CC}$ through the transistor 108. This causes transistor 105 to conduct, thereby charging node 113. When the $\overline{\phi}$ signal again becomes positive, node 114 is pulled towards ground potential through transistor 109, and thus transistor 105 ceases to conduct. However, node 113 is maintained at $V_{CC}$ by the transistor 101. As mentioned, transistor 105 has a relatively low resistance, and thus, quickly pulls the output node 113 towards $V_{CC}$. Thus, the output port serves as a true high level latched output, or as a pull-up resistor for an external device. This permits greater flexibility in coupling the computer to external circuits.

When a binary zero or low level signal is applied to line 118, transistor 107 does not conduct, and hence node 115 is maintained at the $V_{CC}$ potential by the transistor 106. This causes transistor 104 to conduct, and pulls node 113 towards ground potential. Since node 115 is at a $V_{CC}$, transistor 110 conducts preventing the pull-up transistor 105 from conducting.

Assume that a binary one has been previously written onto node 113 and pad 100 and that a binary zero is to be externally applied to the pad 100. Note that prior to this time since node 113 is at $V_{CC}$, transistor 102 is conducting, coupling line 119 to ground. When the binary zero is applied to pad 100, by way of example, from a TTL circuit, this external circuit is readily capable of over-riding the small sustaining circuit provided through the transistor 101, and thus, quickly discharges node 113. When this occurs, the depletion node transistor 103 pulls line 119 to the $V_{CC}$ potential providing the appropriate signal on line 119. At the beginning of each buffer cycle when data is to be accepted from external sources, line 118 is brought high by the port control means. This enables a binary one to be externally applied to pad 100 when this pad has previously been latched to ground through transistor 104.

Thus a buffer for an MOS computer has been disclosed. The buffer utilizes MOS devices and it enables a single data port to have the characteristics of a bidirectional data port.

We claim:

1. In an MOS computer, a buffer means for coupling a computer input data line and a computer output data line to a single computer port means where a control signal is generated by computer port control means at the beginning of each buffer cycle comprising:
   a first MOS device coupling said port means to a source of potential;
   a second MOS device coupled to said port means for selectively coupling said port means to such source of potential, the gate of said second MOS device being coupled to said control signal;
   a third MOS device coupled to said port means for selectively discharging said port means, the gate of said third MOS device being coupled to said computer output data line;
   said computer output data line being coupled to the gate of said second MOS device, and said computer input data line being coupled to said port means,
   whereby said port means has the characteristics of a bidirectional data port means.

2. The buffer means defined by claim 1 wherein said second and third MOS devices have substantially less resistance than said first MOST device.

3. The buffer means defined by claim 2 wherein said port means is coupled to said input data line through a first inverter means.

4. The buffer means defined by claim 3 wherein said output data line is coupled to said gate of said third MOS device through a second inverter means, said second inverter means being coupled to said gate of said second MOS device through a fourth MOS device.

5. The buffer means defined by claim 4 wherein said first MOS device comprises an n-channel depletion load.

6. The buffer means defined by claim 5 wherein said first inverter means includes an n-channel depletion load coupled to said input data line.

7. The buffer means defined by claim 6 wherein said second inverter means includes an n-channel depletion load coupled to said gates of said third and fourth MOS devices.

8. The buffer means defined by claim 7 wherein said gate of said second MOS device is coupled to such source of potential through an n-channel depletion load.

9. The buffer means defined by claim 8 wherein said gate of said second MOS device is coupled to ground through the parallel combination of said fourth MOS device and a fifth MOS device, said fifth MOS device having its gate coupled to receive such control signal.

* * * * *